United States Patent [19]

Arima et al.

[11] Patent Number: 5,236,630
[45] Date of Patent: Aug. 17, 1993

[54] CONDUCTOR PASTE CONTAINING HIGH AMOUNTS OF EITHER MOLYBDENUM OR TUNGSTEN

[75] Inventors: Hideo Arima; Takashi Kuroki, both of Yokohama; Masao Sekihata, Kunitachi; Mituru Fujii, Hadano; Mutsumi Horikoshi, Machida, all of Japan

[73] Assignee: Hitachi, Ltd., Tokyo, Japan

[21] Appl. No.: 561,916

[22] Filed: Aug. 2, 1990

[30] Foreign Application Priority Data

Aug. 7, 1989 [JP] Japan .................. 1-202852

[51] Int. Cl.$^5$ .............................................. H01B 1/02
[52] U.S. Cl. .................................. 252/512; 252/500; 252/515; 106/105
[58] Field of Search .............. 252/515, 512, 500; 106/1.05

[56] References Cited

U.S. PATENT DOCUMENTS 4,493,789  1/1985  Ueyama et al. ............... 252/521
4,576,735  3/1986  Kuroki et al. ................. 252/512
4,940,849  7/1990  Morris et al. ................... 252/515

Primary Examiner—Paul Lieberman
Assistant Examiner—Bradley A. Swope
Attorney, Agent, or Firm—Antonelli, Terry, Stout & Kraus

[57] ABSTRACT

This invention provides a conductor paste having a low resistivity (about 10 $\mu\Omega$.cm or below) and capable of retaining a film thickness of 25 to 35 $\mu$m after baking by composing the paste from 85 to 96 wt. % of a metal powder having a resistivity of 10 $\mu\Omega$.cm or below and 4 to 15 wt. % of an organic vehicle containing 5 to 13 wt. % of a binder. The invention also provides a process for producing the above-described conductor paste, in which 85 to 96 wt. % of a metal powder having a resistivity of 10 $\mu\Omega$.cm or below and 4 to 15 wt. % of an organic vehicle containing 5 to 13 wt. % of a binder are forcibly passed between the barrel-shaped rolls in a kneader and thereby kneaded to form a paste, wherein the roll interval in the kneader is adjusted so that the smallest distance between the adjoining barrel-shaped rolls becomes 5 $\mu$m or less and the shear rate therebetween is set at 1,000 s$^{-1}$ or more.

5 Claims, 6 Drawing Sheets

CONDUCTOR PASTE CONTAINING HIGH AMOUNTS OF EITHER MOLYBDENUM OR TUNGSTEN

BACKGROUND OF THE INVENTION

This invention relates to a conductor paste, a process for producing it, circuit substrates using such a conductor paste, and electronic circuit modules comprising semiconductor elements mounted on such substrates in operative arrangement.

In the art of electric circuits, remarkable progress has been made in packaging density and integration of electronic parts in recent years. In line with such progress in the art, the request has become stronger for higher density circuit substrates on which the electric parts are mounted, and many intensive studies have been made for higher wiring density and multi-layer lamination in the manufacture of substrates. Particularly in memory and logic devices having a multiplicity of highly integrated LSI chips mounted compactly therein, such as electronic computers, progress in techniques for wiring density and multi-layer structure of substrates is remarkable. Hitherto, the highest density packaging has been achieved with the multilayer wiring substrates of the green sheet system. In the manufacture of this type of substrate, a conductor paste, especially a paste containing a high-melting point metal powder, such as tungsten paste or molybdenum paste, is generally used for forming conductor wiring patterns. In these conductor pastes such as tungsten paste, as for instance mentioned in Japanese Patent Application Laid-Open (Kokai) No. 62-143981, the content of metal powder in the paste is mostly in the range of 75 to 85% by weight, and the specific resistahce (resistivity) of the conductor after printing and baking by using the paste is about 20 $\mu\Omega$.cm in both cases of tungsten and molybdenum pastes.

In case of producing a conductor having a resistivity of 0.5 $\Omega$ or less per cm by using this type of conductor paste, it is usually tried to form a conductor having the dimensions of about 150 $\mu$m in width, about 40 $\mu$m in thickness and about 4,000 $\mu$m$^2$ in effective sectional area (the sectional shape being close to rhomb).

For obtaining a conductor thickness of 40 $\mu$m, it is necessary to apply the paste so that the paste thickness after circuit pattern printing and drying will become 50 to 60 $\mu$m by taking into consideration possible slackening at the time of sheet lamination and shrinkage at the time of sintering. This makes the printing operation relatively difficult to perform. It is also practiced to form a paste using a powder of a metal such as tungsten which has been pulverized to an average particle size of 1 $\mu$m or less for the purpose of lowering resistivity. This scheme has succeeded in reducing resistivity of the conductor after printing and baking to about 15 $\mu\Omega$.cm. This low resistivity paste, however, is substantially incapable of thick printing and the film thickness can reach only the order of 20 to 30 $\mu$m at the greatest after baking. After all, the resistivity per unit length becomes equal to or even less than that of the conventional pastes. One reason for this phenomenon will be that the surface area of the metal component in the paste increases due to pulverization of metal powder, and this causes a corresponding increase of the amount of vehicle, resulting in a reduced metal content in the paste.

Under these circumstances, the request for higher wiring density is ardent, and now circuit patterns with a conductor width of less than 100 $\mu$m have become necessary in the art. In case the conductor width is reduced from 150 $\mu$m to 100 $\mu$m, if the film thickness after baking is made 60 $\mu$m, it is possible to realize the same paste as the conventional ones, only in calculations. Actually, however, if the conductor width is made 100 $\mu$m, the upper threshold value of the film thickness allowable for a conventional paste is about 30 $\mu$m, which means that it is impossible to obtain a film having greater than about half of the desired thickness. This is mainly due to slackening of conductor paste at the time of printing, collapse or lateral spreading of the wiring conductors when laminating the sheets, and shrinkage at the time of sintering. Therefore, in order to acquire the same resistivity as the conventional pastes even in high density packaging, there is required a paste whose specific resistance after baking is about 10 $\mu\Omega$.cm, which is half of that of the conventional pastes, and also capable of providing a film thickness of 25 to 35 $\mu$m after baking. It has been impossible to meet the-se requirements with the prior art technology.

SUMMARY OF THE INVENTION

The present invention is designed to give a solution to the problems of the prior art mentioned above. To this end, the present invention has for its first object to provide a low-resistance conductor paste having a resistivity of about 10 $\mu\Omega$.cm or less and capable of securing a film thickness after baking of 25 to 35 $\mu$m.

The second object of this invention is to provide a method for producing such a conductor phase.

A third object of the invention is to provide a circuit substrate using such a paste, and the fourth object of the invention is to provide an electronic circuit module having a multiplicity of interconnected electronic circuitries mounted on the substrate.

As a result of many and various experimental attempts and researches for realizing a conductor paste with a low resistivity of 10 $\mu\Omega$.cm or below and capable of securing a film thickness after baking of 25 to 35 $\mu$m, the present inventors found that the above objects can be attained by the means and inventive steps described below.

In brief, the first object of the present invention can be accomplished by providing a conductor paste comprising 85 to 96% by weight of a metal powder having a resistivity of 10 $\mu\Omega$.cm and 4 to 15% by weight of an organic vehicle, the vehicle containing 5 to 13% by weight of a binder.

The second object of the invention can be achieved by providing a process for producing conductor paste, which comprises kneading 4 to 15% by weight of an organic vehicle containing 5 to 13% by weight of a binder and 85 to 96% by weight of a metal powder having a resistivity of 10 $\mu\Omega$.cm or less by passing these materials forcibly between the barrel-like kneader rolls arranged to be spaced not more than 5 $\mu$m at the minimum distance from each other and adjusted to a shear rate of 1,000 sec$^{-1}$ or above.

The third object of this invention can be attained by providing a circuit substrate comprising a green sheet and a conductor paste printed and baked to said green sheet and composed of 85 to 95% by weight of a metal powder having a resistivity of 10 $\mu\Omega$.cm or less and 4 to 15% by weight of an organic vehicle, the vehicle containing 5 to 13% by weight of a binder. The fourth object of the present invention can be accomplished by providing an electronic circuit module comprising: a circuit substrate comprising a green sheet and a conductor paste printed and baked on the green sheet and composed of 85 to 96% by weight of a metal powder having a resistivity of 10 $\mu\Omega$.cm or less and 4 to 15% by weight of an organic vehicle, the vehicle containing 5 to 13% by weight of a binder; and semiconductor elements mounted on the circuit substrate.

The present invention will be described in further detail below.

The above-specified composition of the materials according to the present invention makes it possible to obtain a paste comprising the fine metal particles packed to a high density and having a moderate degree of fluidity. The paste thus obtained has a high metal content unlike the conventional pastes as described above, so that even if the conductor width after baking is made 100 $\mu$m, it is possible to easily obtain a film thickness of 25 to 35 $\mu$m while maintaining its resistivity at about 10 $\mu\Omega$.cm or below.

The above-described production process features the arrangement of kneader rolls spaced not more than 5 $\mu$m in the minimum distance from each other. This roll arrangement enables application of mixing and kneading force to the individual metal particles, which facilitates formation of primary particles from the agglomerate metal particles, dispersion of metal particles into the vehicle, and optimization of grinding and particle size distribution of the metal particles.

Further, the selection of shear rate of 1,000 sec$^{-1}$ in the method of this invention is effective for enhancing fluidity of the vehicle to enable incorporation of a large amount of metal particles into the vehicle and to thereby improve mixing and kneading efficiency.

DESCRIPTION OF PREFERRED EMBODIMENTS

Figure 5:
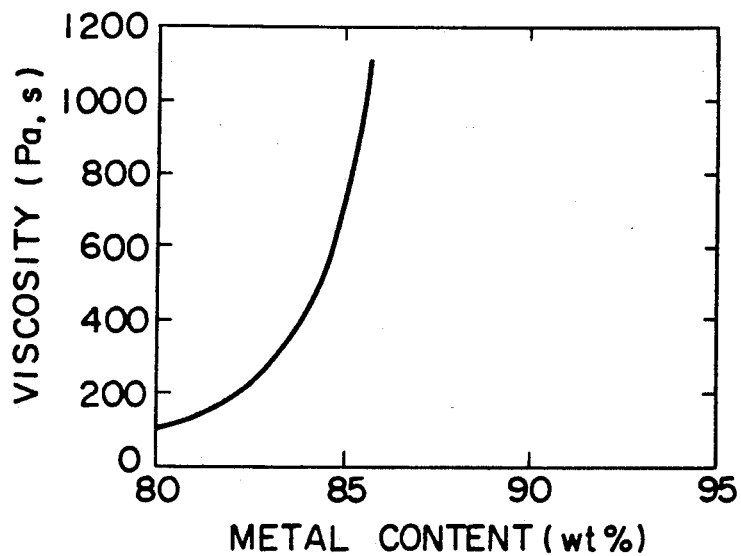
FIG. 5 is a graph showing the relation between paste composition and viscosity.

In conventional conductor pastes, the content of metal powder such as tungsten powder is set at less than 85% by weight, because if it exceeds 85% by weight, the viscosity of the conductor pastes increases sharply as shown in FIG. 5 to make it unable to perform normal printing, or even if a paste could be formed, such a paste, because of high viscosity, is incapable of sufficient transfer to the sheet through a screen to cause disconnection or other trouble. Paste conductor itself should normally be of low resistance, and it has generally been considered that the reduction of content of the inorganic impurities which hamper sintering of the metal particles or the pulverization of the metal particles is greatly conducive to the reduction of resistance, while the amount of the organic vehicle which is substantially evaporated away in the drying step after paste printing is almost uninfluential.

However, the elaborate experiments by the present inventors have made it clear that the amount of the organic vehicle and the amount of the binder constituting a component of the vehicle are the highly influencial factors for reducing resistance of the conductor paste, and by using a composition of this invention such as described in detail later, it has become possible to realize reduction of paste resistivity and thick printing.

This is assumed attributable to the following reason. For instance, in a tungsten paste, if it is composed of 90 to 96% (more preferably 92 to 94%) by weight of tungsten powder and 10 to 4% (more preferably 6 to 8%) by weight for an organic vehicle, there presents itself a situation where the organic vehicle exists only slightly mingled in tungsten powder in the early stage of mixing and kneading, and it seems that this mixture can hardly be made into a viscous paste. However, as mixing and kneading is carried out in the manner described below, the vehicle is urged to separate and the masses thereof having the metal particles adhering to the surfaces gradually take in the metal particles into the vehicle, thus increasing the number of metal particles in the vehicle. As the number of metal particles approaches saturation, it is considered that there take place break-up of agglomerated metal particles into primary particles, rearrangement of metal particles and crushing thereof in the vehicle due to the external force applied for mixing and kneading. As a result, there are formed in the vehicle the spaces that allow entrance of metal particles, so that the vehicle further takes in metal particles, and break-up of metal particle aggomerates into primary particles, rearrangement of metal particles and crushing thereof are repeated in the similar way. Accordingly, the metal particles are packed up to a higher density in the masses of vehicle, and ultimately, the masses of vehicle which have been separate from each other eventually merge up into a single mass, that is, make up a paste, as the number of separate metal particles decreases. It is considered that the above-described phenomenon taking place in the mixing and kneading step effectuates optimization of size of the metal particles and promotes uniform dispersion thereof, thus forming a paste packed with metal particles at a high density and yet having a favorable fluidity. This coupled with promoted interparticle sintering shrinkage at the time of baking enables formation of a low-resistivity conductor paste.

When using a paste prepared in the manner described above, it is possible to secure a film thickness of 25 to 35 $\mu$m with ease even if the conductor width after baking is made 100 $\mu$m, because of the high metal content in paste unlike the conventional pastes.

The present inventors have also considered that the characteristics of the vehicle should also be an important factor in forming the paste.

Figure 6:
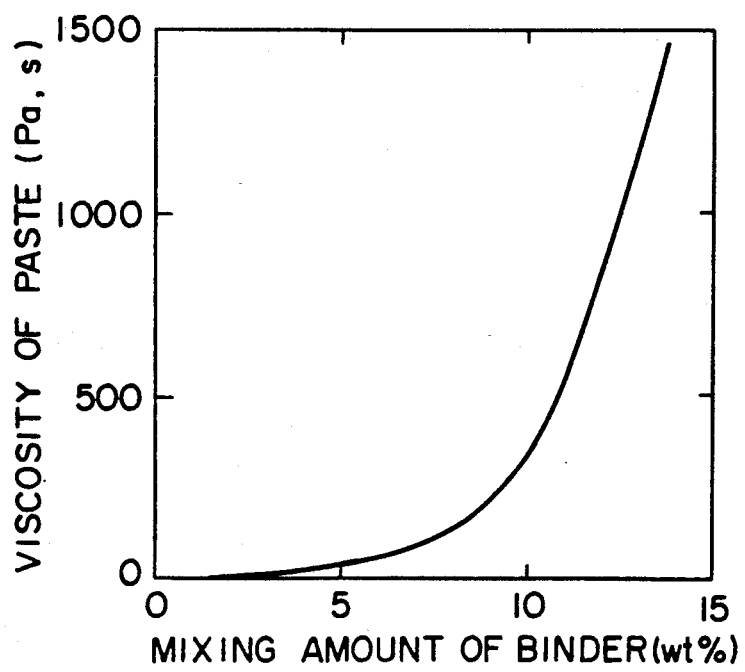
FIG. 6 is a graphic representation of the relation between the amount of binder in the vehicle and viscosity of the paste.

In this concept, the present inventors have prepared tungsten pastes by fixing the tungsten content constant at 90 wt. % while varying the mixed amount of binder in the remaining 10 wt. % vehicle, and the viscosity of the resultant tungsten pastes was measured. The results are shown in FIG. 6.

The paste preparation method employed here is the same as used in Example 4 given later. That is, there were used tungsten (W) powder having an average particle size of 2 μm, 45 cps of ethyl cellulose as binder and n-butylcarbitol acetate (nBCA) as solvent, and the materials were mixed and kneaded by using a roll mill to form a paste. Viscosity was expressed by the value at a shear rate of 4 $s^{-1}$ which is generally employed.

It was found from this experiment that when the binder content in the vehicle exceeds 13 wt. %, the vehicle viscosity rises up sharply and the conductor paste made by using a vehicle with such a high binder content also becomes excessively high in viscosity, so that transfer of the paste to the sheet at the time of circuit pattern printing becomes improper to cause disconnection of the conductor.

Further, since the distance between metal particles is widened by the binder in the paste and in the state of film after printing, sintering of the metal particles at the time of baking is retarded to cause an increase of resistivity of the conductor after baking. On the other hand, when the binder content in the vehicle is less than 5 wt. %, there can not be obtained a desired viscous paste by the mixing and kneading operation, probably because of the insufficient amount of binder for binding the metal particles. If a circuit pattern is printed and baked by using such a composition, the resultant conductor paste shows a high resistivity. This is probably for the reason that since the vehicle is not brought into a viscous state, it is weak in holding force of the metal particles taken in the vehicle, discouraging break-up of particle agglomerates into primary particles and rearrangement and crushing of the metal particles by the external force required for mixing and kneading.

A process for preparing a conductor paste in accordance with an embodiment of the present invention is described below.

With a composition with a tungsten content of 90 wt. % or above as in this example of the present invention, it has been difficult to efficiently prepare a paste having a high density and a good fluidity by using an automatic mixer-kneader using a mortar and a pestle or by using an ordinary roll mill. This is probably for the reason that when the tungsten content is more than 85 wt. %, too much time is required for covering up the metal powder with the vehicle and it also takes much time to perform works such as rearrangement of the metal powder for effecting high-density packing.

In order to realize efficient preparation of the high-density paste, the present inventors have conceived the following method. That is, by using a mixing machine such as a roll mill or a kneader having a space for forcibly passing the paste in the mixing and kneading operation and by not fixing the roll-to-roll distance and the distance between the blade and the inner wall of the contained provided that the minimum distance is 5 μm or less while the distance at the area therearound is not less than 5 μm, the paste is passed through the portion of the minimum distance at a shear rate of 1,000 $s^{-1}$ or more to thereby elevate the mixing and kneading efficiency. By making the minimum value of the inter-roll distance and the distance between the blade and the container inner wall 5 μm or less, it becomes possible to apply the mixing and kneading force to the level of metal particles, which expedites break-up of particle agglomerates into primary particles, dispersion of metal particles into the vehicle, crushing or metal particles, optimimization of particle size distribution, etc.

Figure 7:
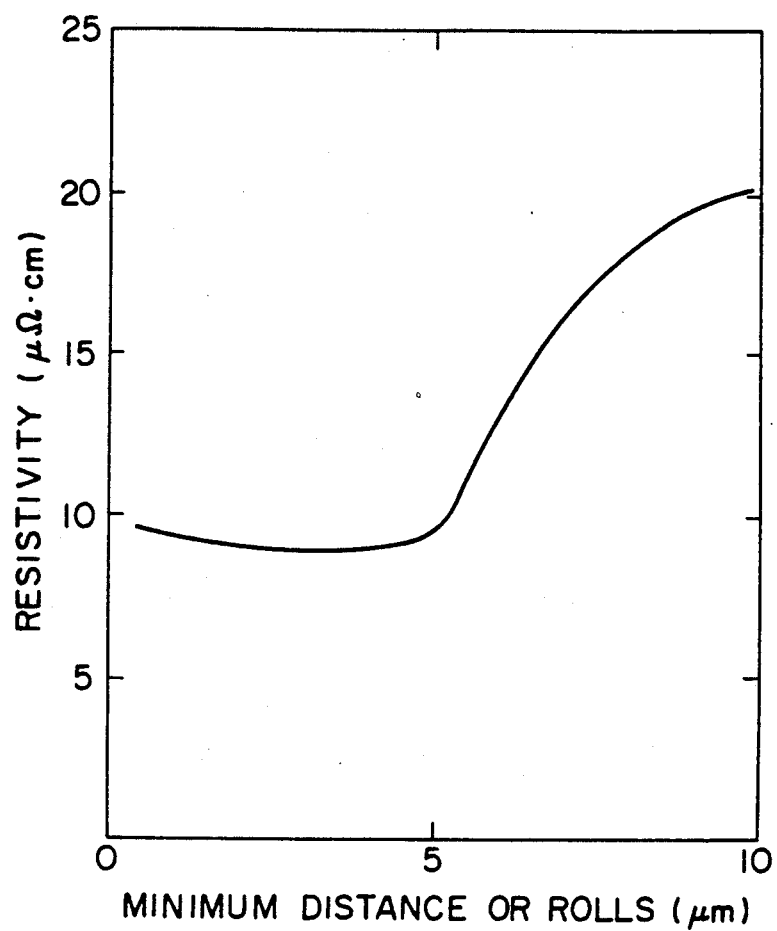
FIG. 7 is a graph showing the relation between minimum distance of rolls and resistivity of the paste.

The above achievement is based on the results of the following experiment conducted by the present inventors. The experiment comprises preparing the pastes by setting the minimum distance of rolls at a value between 0 and 10 μm and measuring resistivity of the conductor when the prepared pastes were printed and baked. The results are shown in FIG. 7. The kneading time in the roll mill was 2 hours. The paste was composed of 94 wt. % of tungsten powder having an average particle diameter of 2 μm and 6% of a vehicle. The vehicle was prepared by dissolving 5 wt. % of 45 cps ethyl cellulose in nBCA. The shear rate of the roll mill was adjusted to 5,000 $s^{-1}$. From FIG. 7, it is seen that paste resistivity increases notably when the minimum distance of rolls exceeds 5 μm. If the roll interval and the distance between the blade and the container inner wall are all made less than 5 μm, this does not necessarily lead to an improvement of mixing and kneading efficiency since the amount of the paste passing the spaces is reduced. So, the present inventors have devised a design in which the distance across both sides of the portion with the minimum distance of 5 μm or less becomes gradually wider as the position becomes more distant from the portion of the minimum distance, until the maximum distance becomes, for instance, 30 μm or greater. In this case, the rolls assume a barrel-like configuration. The masses of vehicle containing metal powder are expanded by the barrel-like rolls or blade, and the central part of the expanded vehicle, when passing both sides of the minimum distance of rolls, is forced to pass through the portion of minimum distance, and this is considered conducive to an improvement of mixing and kneading efficiency.

Shear rate is also an important parameter. In a test conducted by keeping the shear rate below 1,000 $s^{-1}$, it was impossible to obtain a paste having a desired fluidity by about 4 hours of mixing and kneading operation. This is probably due to the reason that the viscosity of vehicle, especially its viscosity in the early phase of mixing and kneading, has a tendency to lower in accordance with the rise of shear rate, so that if the shear rate is kept below 1,000 $s^{-1}$, the vehicle fluidity remains low, hindering the vehicle from taking in the metal particles, resulting in a low mixing and kneading efficiency.

As to the material for forming the space portion of the kneader in the mixing and kneading operation for making said conductor paste, it is desirable to use a material with a high hardness such as, for example, titanium, tungsten, molybdenum, diamond, tungsten carbide, titanium carbide, tantalum carbide, alumina, titanium oxide, zirconium oxide and the like. Use of such material for the space portion can further improve the mixing and kneading efficiency.

Figure 8:
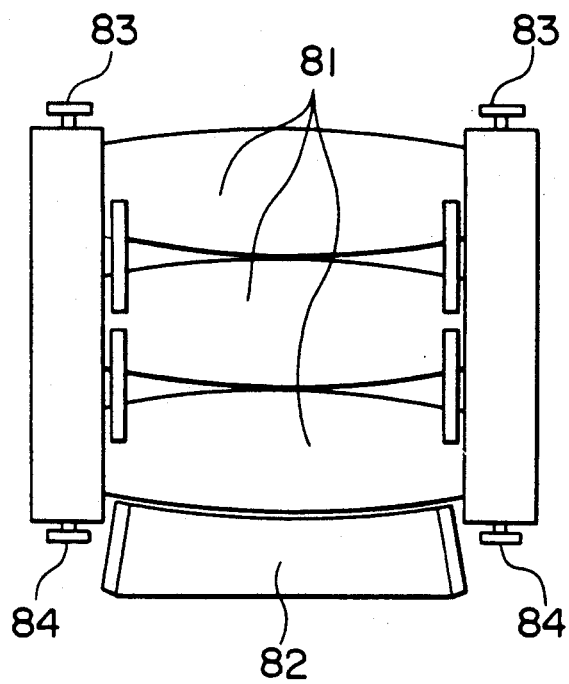
FIG. 8 is a schematic plan view of a kneader in accordance with the present invention.

A schematic plan view of the kneader is shown in FIG. 8. The kneader comprises an array of barrel-like rolls 81, a paste saucer 82, a pair of rear roll interval adjusting screws 83, and a pair of front roll interval adjusting screws 84.

In order to improve the pasting time efficiency, it is expedient to regulate the primary particles of the raw metal powder, namely the metal powder before it is subjected to mixing and kneading treatment and used for the conductor paste, so that the average diameter of the primary particles will be in the range of 0.5 to 10

μm. If the average diameter of the primary particles of metal powder is less than 0.5 μm, much time is taken for perfectly covering the metal powder with a vehicle because of too large a surface area of metal powder. In addition, the metal powder can hardly be made into primary particles because of high cohesive force of the metal particles. For instance when tungsten powder having an average particle diameter of 0.3 μm is kneaded by a roll mill for about 2 hours, there is produced a highly viscous paste whose viscosity is as high as about 1,000 Pa.s at a shear rate of 4 s$^{-1}$, which makes it almost unable to perform printing on the paste. Also, when such a paste is baked to make a metal conductor, the obtained conductor has a relatively high resistivity—about 15 μΩ.cm.

On the other hand, if the average diameter of the primary particles of metal powder is greater than 10 μm, there may take place clogging of the screen in the course of circuit pattern printing due to too large diameter of the initial metal powder, non-uniformity of conductor width after printing and a high degree of surface roughness. Further, in case the metal particles are pulverized in the mixing step, a long time is required until the desired particle diameter can be obtained.

While tungsten has been used as metal powder in the above-described conductor paste preparation, basically the same result can be obtained when using molybdenum in place of tungsten. This is considered due to close analogy of chemical properties of these two metallic elements.

In the case of molybdenum, it was possible to obtain a paste with low resistivity and good fluidity by regulating the total amount of metal powder in the paste in the range of 85 to 94 wt. %. A slight difference in paste composition from the case of using tungsten is considered due to the lower specific gravity of molybdenum than tungsten.

Figure 1:
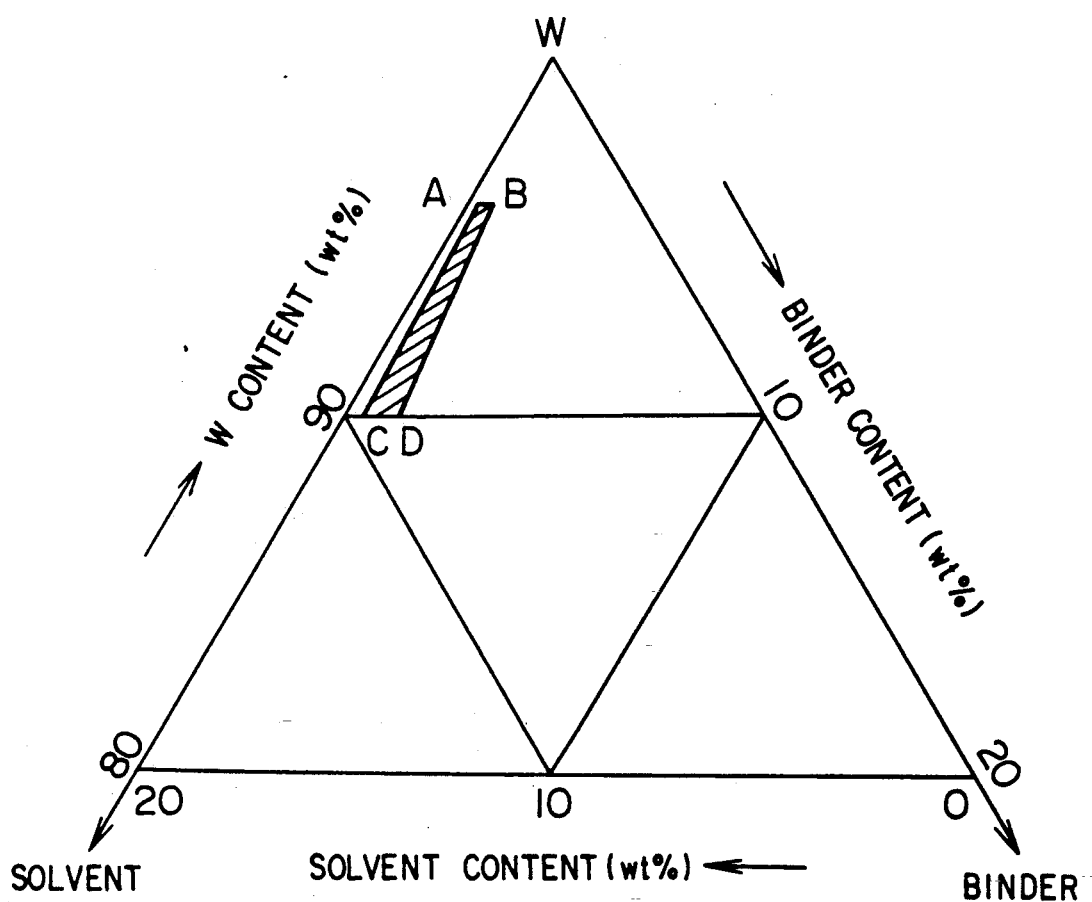
FIG. 1 is a three-way compositional diagram showing the composition of a conductor paste using tungsten powder in an embodiment of the present invention.

A three-way compositional diagram of a conductor paste using tungsten powder according to the present invention is shown in FIG. 1. The paste composition comprises 90 to 96 wt. % of tungsten and 4 to 10 wt. % of a vehicle, and since the amount of binder in the vehicle whose proportion in the composition is 4 to 10 wt. % as said above is 5 to 13 wt. %, the binder content in the composition is 0.2 to 0.52 wt. % when the proportion of vehicle is 4 wt. % and the binder content is 0.5 to 1.3 wt. % when the proportion of vehicle is 10 wt. %. When the solvent content is calculated likewise, since the solvent occupies 87 to 95 wt. % of the vehicle composition, the solvent content in the paste composition is 3.48 to 3.8 wt. % when the vehicle proportion is 4 wt. % and the solvent content in the paste composition is 8.7 to 9.5 wt. % when the vehicle proportion in the composition is 10 wt. %.

Therefore, the shaded area in the triangular diagram, that is, the area enclosed by the lines connecting the four points A, B, C and D indicates the range of composition according to the present invention.

The respective points A, B, C and D in the triangular diagram represent the following compositions:

|   | W content | Binder content | Solvent content |
|---|---|---|---|
| A: | 96 wt % | 0.2 wt % | 3.8 wt % |
| B: | 96 wt % | 0.52 wt % | 3.48 wt % |
| C: | 90 wt % | 0.5 wt % | 9.5 wt % |

-continued

|   | W content | Binder content | Solvent content |
|---|---|---|---|
| D: | 90 wt % | 1.3 wt % | 8.7 wt % |

Figure 2:
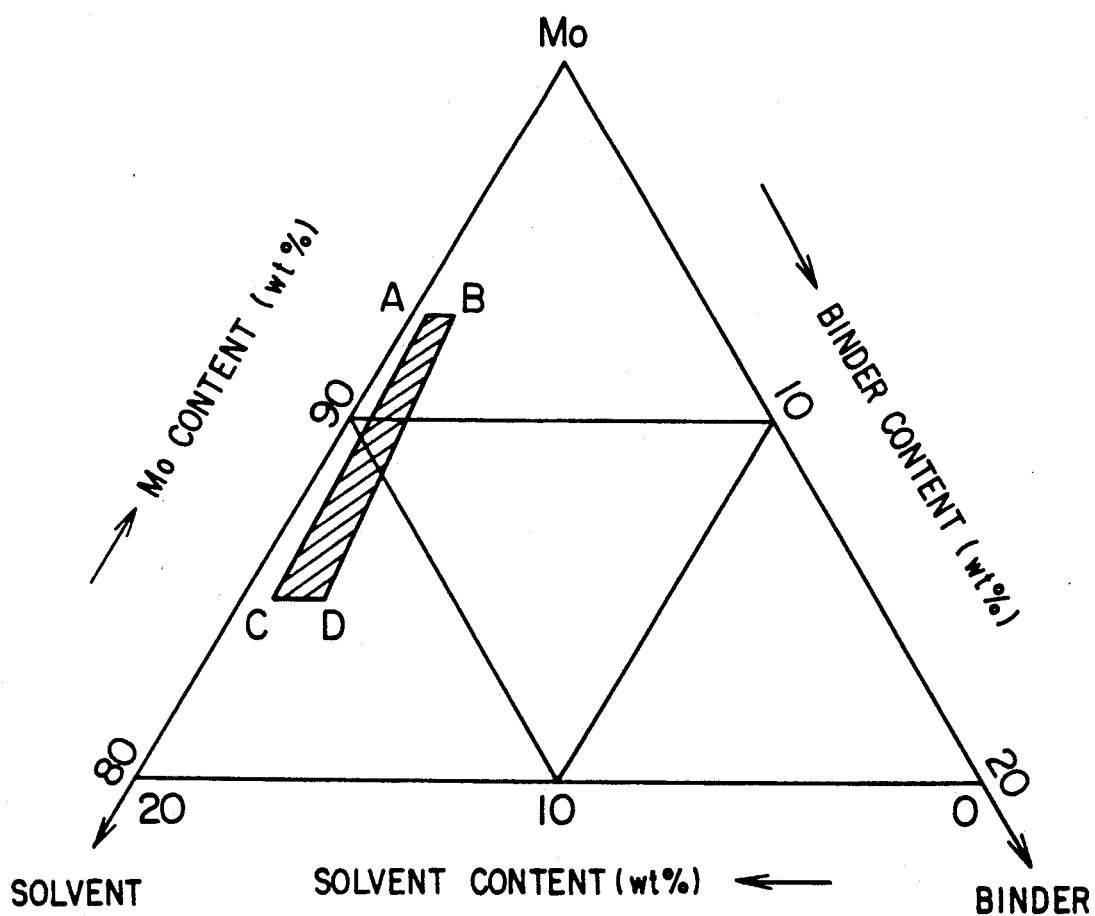
FIG. 2 is a three-way compositional diagram showing the composition of a conductor paste using molybdenum powder according to another embodiment of the present invention.

FIG. 2 is a three-way compositional diagram of a conductor paste using a molybdenum powder. The binder and solvent contents in the conductor paste were calculated in the same way as in the diagram of FIG. 1. The shaded area in the diagram, that is, the area enclosed by the lines connecting the four points A, B, C and D indicates the range of composition according to the present invention. The respective points A, B, C and D in the diagram represent the following compositions:

|   | Mo content | Binder content | Solvent content |
|---|---|---|---|
| A: | 94 wt % | 0.35 wt % | 6.65 wt % |
| B: | 94 wt % | 0.91 wt % | 6.09 wt % |
| C: | 85 wt % | 0.75 wt % | 14.25 wt % |
| D: | 85 wt % | 1.95 wt % | 13.05 wt % |

EXAMPLE 2

(1) Preparation of Conductor Paste

A weighed quantity of tungsten powder having an average particle diameter of 2.0 μm was mixed with a vehicle containing 9 wt. % of a binder dissolved in a solvent. Used as binder was 45 cps of ethyl cellulose. n-Butylcarbitol acetate (nBCA) was used as solvent. These materials were mixed in an automatic mixer using a mortar and a pestle for about one hour.

The mixture, with the masses of particles formed therein, was subjected to a roll mill. Each of the rolls in the roll mill was barrel-shaped and had its stainless steel surface coated with tungsten carbide. The roll interval in the roll mill was about 30 μm at the smallest initially. By about 30 minutes of roll mill operation, most of the mixture was made into a slightly lustrous state. Then the roll interval was adjusted so that the smallest distance between the central parts of adjoining rolls would become 5 μm. In this case, the distance between the corresponding ends of adjoining rolls was 35 μm at the largest. Under this state, while setting the shear rate between the smallest distance portions of adjoining rolls at 1,000 s$^{-1}$, the roll mill operation was carried out for about 2 hours to form a paste.

During this roll mill operation, the paste portion which has moved to the roll ends was returned to the central parts of the rolls repeatedly by using a spatula.

The relation of viscosity to the completed conductor paste compositions at a temperature of 25° C. and a shear rate of 4 s$^{-1}$ was as shown in Table 1.

The results of Table 1 indicate realization of low resistivity (below 10 μΩ.cm) after baking of the conductor pastes with the compositions in which the tungsten powder content is in the range of 90 to 96 wt. %. This level of resistivity is about ½ of that of the conventional pastes.

The more preferred range of tungsten content is 92 to 94 wt. %. This is ascribed to the fact that the following effect can be obtained by reducing wiring resistivity close to 9 μΩ.cm. That is, generally, when performing printing of wiring, a costly metal mask (screen mask) is used for allowing enlargement of conductor film thickness after printing. However, if it becomes possible to reduce the conductor film thickness for obtaining a desired resistivity (in the present invention, about 10% reduction of resistivity, from 10 to 9 μΩ.cm, can be made), it enables use of an inexpensive emulsion mask which is employed for ordinary printing. Here, "metal mask" comprises a metal mesh having laminated thereon a metal film having patterned high-density pores. By use of a metal mask, it is possible to increase the film thickness.

(2) Preparation of thick-film wiring substrate

By using the previously prepared conductor pastes, printing was made by a stencil printer n five different types of alumina green sheets having about 100 μm through-holes punched at a pitch of 200 to 500 μm and also having a film thickness of about 200 μm. The through-holes were also filled with the pastes. Then conductor wiring patterns with a width of 100 μm were printed with the pastes on the surfaces of the respective alumina green sheets by using a stencil printer. The distance between the adjoining lines of each the conductor wiring pattern was 200 μm at the smallest. The conductor film thickness, although somewhat variable depending on paste composition or viscosity, is generally about 45 μm after drying. Only one of the five different alumina green sheets was printed on both sides thereof.

The five sheets were placed one upon the other squarely by making use of guide holes formed at four corners of each sheet. The sheets were pressed at 120° C. to form a laminate. This laminate was heated to 1,600° C. in a hydrogen atmosphere to make a thick-film multi-layer substrate.

Resistivity of the completed substrate was calculated form resistance of wiring portion and sectional shape of conductor portion and shown in Table 1. The conductor width was 100±15 μm and the conductor height (thickness) was 31±6 μm.

The conductor pad on the semiconductor element packaged side of the laminate, the back-side pinned pad and the soldered conductor portion were coated with chromium (0.1 μm), copper (2 μm) and gold (0.1 μm) successively by using the photolithographic and sputtering techniques to fabricate a thick film wiring substrate.

Figure 3:
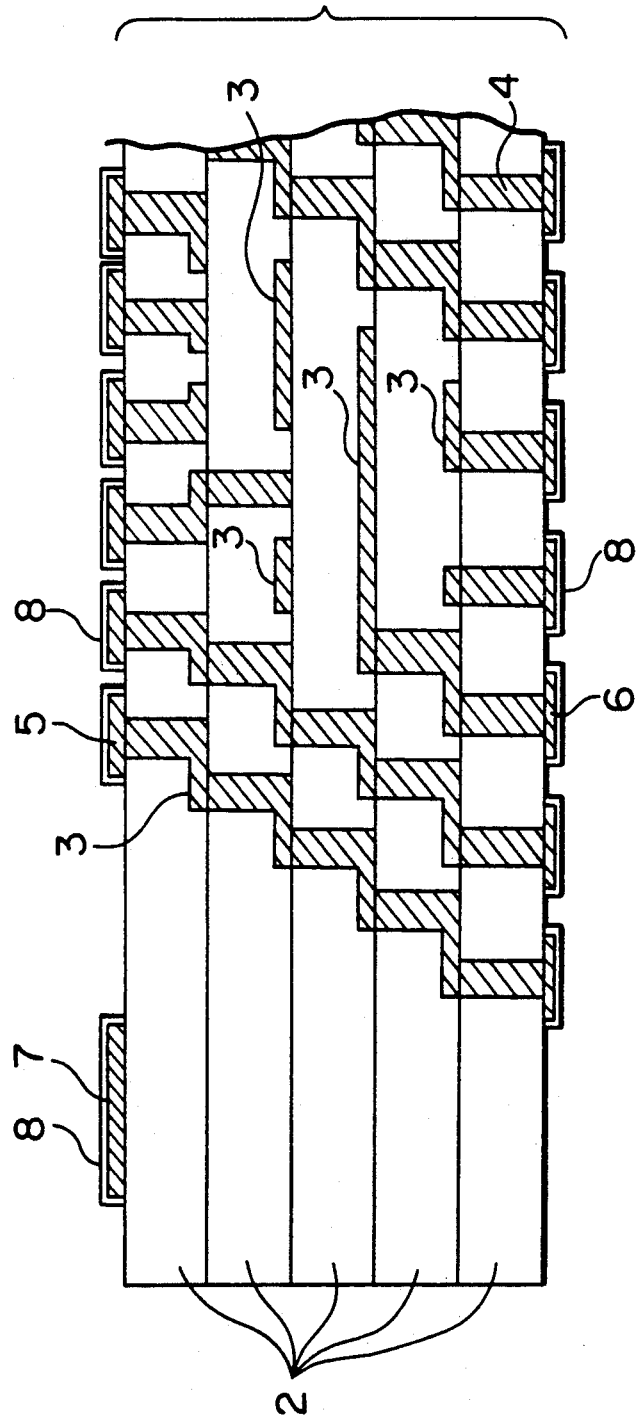
FIG. 3 is a sectional view of the principal parts of a thick film wiring substrate according to an embodiment of this invention.

FIG. 3 is a sectional view of the principal parts of the thus obtained thick film wiring substrate according to this invention. In the drawing, reference numeral 1 indicates the whole mechanism of the substrate, 2 ceramic wiring sheets, 3 low-resistance conductor for wiring, 4 through-hole conductor, 5 semiconductor element connecting conductor, 6 pin connecting conductor, 7 sealing conductor, and 8 thin-film conductor.

From the foregoing, it is appreciated that by making the conductor width about 100 μm which is about ⅔ of that of the conventional substrates and by equalizing the conductor interval with the conductor width, there can be obtained a wiring substrate having about twice as high a packaging density as the conventional products. This means that it is possible to double the functional performance of the substrate as compared with a conventional substrate with the same surface area and to halve the number of circuit layers in comparison with a conventional substrate with the same circuit performance. Also, by applying the principle of this invention to the conductor portion with a large current capacity, it is possible to obtain a wiring substrate with a low calorific value and a thick-film wiring substrate which is free of waveform blunting of high-speed signals.

(3) Manufacture of electronic module.

A high-temperature solder is placed on the pinned pad composed of pin connecting conductors 6 and thick film multi-layer conductors 8 on the underside of the obtained thick-film multi-layer substrate 1 having the structure of FIG. 3 and heated to about 350° C. to connect and fix the pins which had already been placed in the guide holes. Then a solder was placed on the packaging pad composed of semiconductor element connecting conductors 5 and thin-film conductors 8 on the surface of the substrate and heated to about 300° C. to effectuate electric connection and fixing of memory and logic LSI chips. Finally, a low-temperature solder was placed on the solder sealing portion composed of sealing conductor 7 and thin-film conductor 8 on the substrate surface and heated to about 250° C. to connect a Kovar sealing cap to thereby complete an electronic circuit module.

Figure 4:
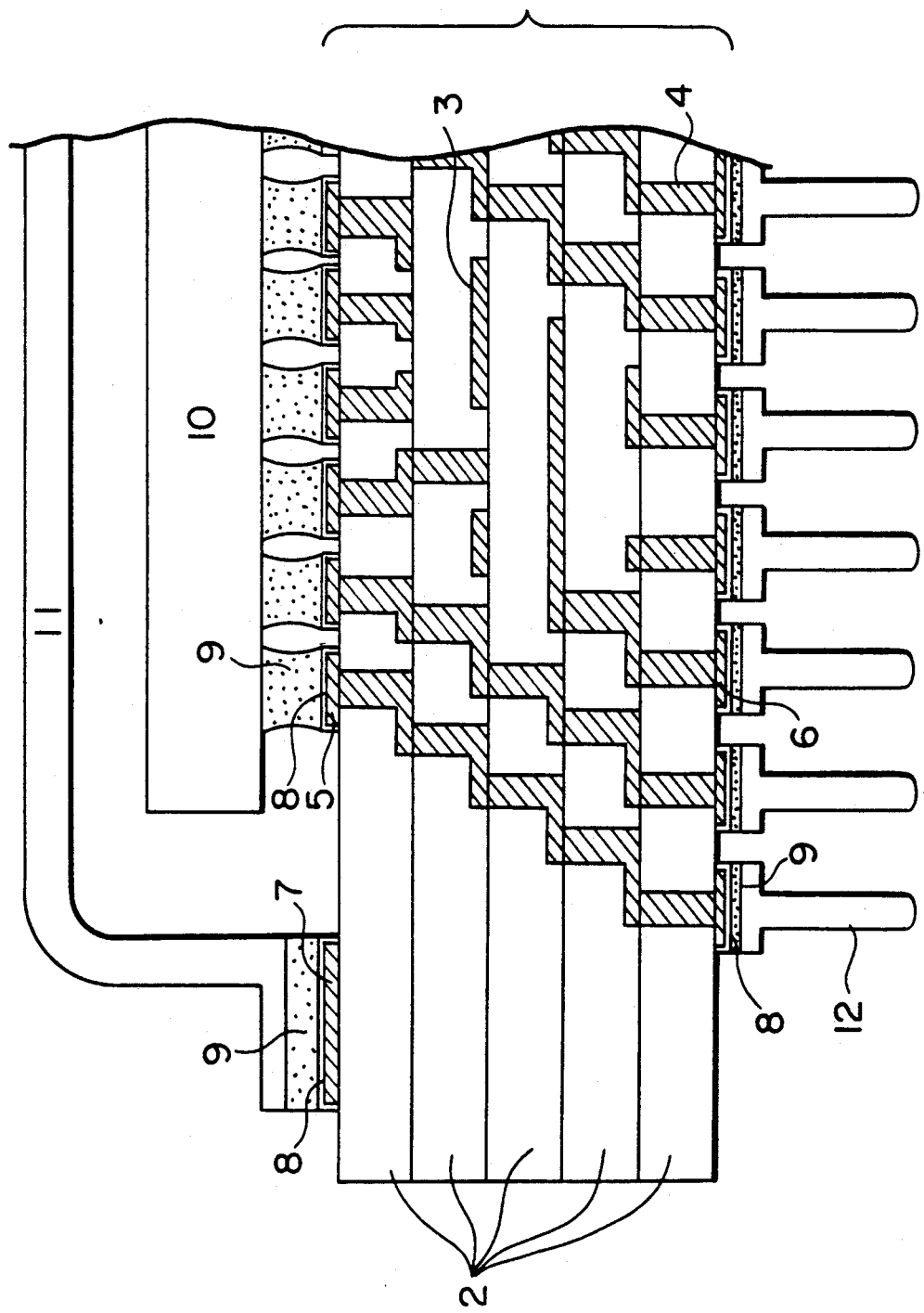
FIG. 4 is a sectional view of the principal parts of an electronic circuit module according to the present invention.

FIG. 4 shows in section the structure of the principal parts of the electronic circuit module obtained in the manner described above according to the present invention. In this drawing, reference numerals 1 to 8 designate the same parts or elements as indicated by the corresponding numerals in FIG. 3, so that no explanation is given on such parts or elements here. 9 refers to solder, 10 to semiconductor element (actually LSI chip), 11 to sealing cap, and 12 to pins.

This construction can realize an about 50% size reduction, twice as high packaging density as possible with the conventional products, and an electronic circuit module capable of high-speed signal propagation.

TABLE 1

| Properties | Tungsten content (wt %) | | | | | |
| --- | --- | --- | --- | --- | --- | --- |
|  | 88 | 90 | 92 | 94 | 96 | 98 |
| Viscosity of conductor paste (Pa · s) | 140 | 170 | 220 | 550 | 1010 | 2500 |
| Resistivity after baking (μΩ · cm) | 15.8 | 9.5 | 8.8 | 9.1 | 9.8 | 13.7 |

EXAMPLE 3

(1) Preparation of Conductor Paste

The tungsten powder with an average particle diameter of 2.0 μm used in Example 2 was weighed out to be 94 wt. % and mixed with 6 wt. % of a vehicle prepared by dissolving 9 wt. % of a binder in a solvent. 45 cps of ethyl cellulose was used as binder and n-butylcarbitol acetate (nBCA) was used as solvent. These materials were mixed by an automatic mixer using a mortar and a pestle for about one hour.

The resulting mixture was subjected to a roll mill. The roll mill was the same as used in Example 2. Initially, the roll-to-roll spacing in the roll mill was so set that it would be about 30 μm at the minimum. After about 30 minutes of roll mill operation, the roll interval was adjusted so that the smallest distance between the bulging central parts of adjoining rolls would become 3 μm. In this case, the distance between the corresponding ends of adjoining rolls was 32 μm, the largest of roll-to-roll distance. Under this condition, by setting the shear rate between the rolls at the smallest distance (3 μm) portion at 3,000 s$^{-1}$, the roll mill operation was carried out for about 2 hours to form a conductor paste. During this operation, the paste which has come to the roll ends was returned to the central parts of the rolls by a spatula from time to time.

The viscosity of the completed conductor paste was 430 Pa.s at 25° C. and a shear rate of 4 s$^{-1}$. Also, resistivity of this conductor paste was about ½ of that of the conventional pastes.

(2) Fabrication of Thick-Film Multi-Layer Wiring Substrate

A 100 μm wide conductor wiring pattern was printed with the paste on an about 200 μm thick mullite green sheet by using a stencil printer. Spacing between the lines of the conductor wiring pattern was 200 μm at the minimum. The conductor film thickness after drying was 42 μm on the average. The wiring pattern, unlike that of Example 2, was designed for verification of conductor resistivity and composed of the straight lines in one direction alone.

A non-printed mullite sheet with a thickness of about 200 μm was placed on the backside of the wiring sheet. Likewise, an about 200 μm thick non-printed mullite sheet was placed on the front side of said wiring sheet in such a manner that said mullite sheet would not cover the wiring conductor ends on the wiring sheet. The assembly was pressed at 120° C. to form a laminate. This laminate was heated to 1,650° C. in a hydrogen atmosphere to make a thick-film substrate. Resistivity of the thus obtained substrate was calculated from resistance of the wiring portion and sectional shape of the conductor portion. The substrate had a conductor width of 100±11 μm, a conductor height (thickness) of 29±4 μm and a resistivity of 8.8 μΩ.cm.

EXAMPLE 4

(1) Preparation of Conductor Paste 94 wt. % of tungsten powder having an average particle diameter of 2.0 μm and 6 wt. % of a vehicle having a binder dissolved in a solvent were mixed. 45 cps ethyl cellulose was used as binder and nBCA as a solvent. There were prepared five types of vehicles, the binder content in these types of vehicles being 2 wt. %, 5 wt. %, 9 wt. %, 13 wt. % and 17 wt. %, respectively.

The materials were mixed by an automatic mixer using a mortar and a pestle for about one hour and then roll-milled after the manner of Example 2. The roll interval in the roll mill was initially so set that the minimum distance between the adjoining rolls would be about 30 μm. After 30 minutes of mixing and kneading in this state, the roll interval was again adjusted so that the smallest distance between the central (bulging) parts of adjoining rolls would become 2 μm. In this arrangement, the distance between the corresponding ends of adjoining rolls was 32 μm, which was the greatest in distance between adjoining rolls. Under this condition, by setting the shear rate between the smallest distance (2 μm) portions of adjoining rolls at 5,000 s$^{-1}$, roll milling was carried out for about 2 hours to form a conductor paste. During this operation, the paste which has run down to the roll ends was brought back to the central parts of the rolls by using a spatula from time to time. In the case of the mixtures in which the binder content in the vehicle was 2 wt. % and 17 wt. %, there remained a portion which could not be made into a viscous paste-like state. In this case, therefore, fabrication of a thick-film substrate was conducted by using only the portion which assumed a paste-like state. The relation of paste viscosity to the vehicle composition in the completed paste at a temperature of 25° C. and a shear rate of 4 s$^{-1}$ was as shown in Table 2.

It is seen from Table 2 that a wiring substrate with a low resistivity below 10 μΩ.cm, as measured after baking, can be obtained when the binder content in the vehicle is in the range of 5 to 13 wt. %. This signifies realization of almost having of resistivity in comparison with the conventional pastes.

(2) Fabrication of Thick-Film Multi-Layer Wiring Substrate

A 100 μm wide conductor wiring pattern was printed with each of the prepared pastes on an about 200 μm thick alumina green sheet by using a stencil printer. Spacing between the lines of the conductor wiring pattern was 200 μm at the smallest. The conductor film thickness, as measured after drying, was 45 μm on the average. This wiring pattern, like that of Example 3, was designed for verification of conductor resistance and composed of the straight lines in one direction alone.

An approximately 200 μm thick non-printed alumina sheet was placed on the back side of the wiring sheet. Also, an approximately 200 μm thick non-printed alumina sheet was placed on the front side of said wiring sheet in such a manner that said alumina sheet would not cover the wiring conductor ends on the wiring sheet. The resulting assembly was pressed under heating at 120° C. to form a laminate. This laminate was heated to 1,600° C. in a hydrogen atmosphere to fabricate a thick-film substrate. Resistivity of the thus obtained substrate was calculated from resistance at the wiring portion and sectional shape of the conductor portion. Dimensional measurements gave a conductor width of 120±40 μm and a conductor height of 36±10 μm. Resistivity was as shown in Table 2.

From the above results, it is appreciated that the conductor width, which is about 120 μm in the substrate of this invention, can be reduced to about ⅔ of that of the conventional products, and when conductor interval and conductor width are assumed to be same, there can be obtained a wiring substrate having about 1.6 times as high density as the conventional products. This connotes the possibility of providing a wiring substrate having 1.6 times as high functional performance as the conventional substrates with the same surface area and of reducing the required number of circuit layers to 1/1.6 of that necessitated in the conventional substrates when the circuits used are supposed to have the same functional performance. Further, by applying the above contrivance of this invention to the conductor portion with a large current capacity as in Example 2, it is possible to realize a thick-film wiring substrate with a low calorific value and free of waveform blunting of high-speed signals.

TABLE 2

| Properties | Binder content (wt %) | | | | |
|---|---|---|---|---|---|
| | 2 | 5 | 9 | 13 | 17 |
| Viscosity of conductor paste (Pa · s) | 110 | 170 | 550 | 1010 | 2020 |
| Resistivity after baking ($\mu\Omega \cdot$ cm) | 14.7 | 9.5 | 9.1 | 9.8 | 15.1 |

EXAMPLE 5

(1) Preparation of Conductor Paste

A weighed quantity, 92 wt. %, of tungsten powder having an average particle diameter of 0.5 $\mu$m and 8 wt. % of a vehicle having 5 wt. % of a binder dissolved in a solvent were mixed. 5 cps of ethyl cellulose was used as binder and nBCA as solvent. These materials were mixed by an automatic mixer using a mortar and a pestle for about one hour.

The resulting mixture was roll milled. The roll mill employed here was almost identical with that used in Example 2, the only difference being that the iron shaft was alumina coated. The roll interval in the roll mill was initially so set that the smallest distance between adjoining rolls would become about 30 $\mu$m. After about 30 minutes of roll milling, the roll interval was adjusted so that the smallest distance between the central parts of adjoining rolls would become 0.5 $\mu$m. In this instance, the distance between the corresponding ends of adjoining rolls was 50 $\mu$m, which was the greatest distance between adjoining rolls in this roll mill. Under this condition and by setting the shear rate between the smallest distance (0.5 $\mu$m) portion of adjoining rolls at 3,000 s$^{-1}$, roll milling was carried out for about 2 hours to form a conductor paste. During this milling operation, the paste which has moved to the roll ends was returned to the central parts of the rolls by a spatula from time to time.

Viscosity of the completed conductor paste, as measured at a temperature of 25° C. and a shear rate of 4 s$^{-1}$, was 570 Pa.s.

(2) Fabrication of Thick Film Multi-Layer Wiring Substrate

A 100 $\mu$m wide conductor wiring pattern was printed with the conductor paste on an about 200 $\mu$m thick mullite green sheet by a stencil printer.

Inter-line spacing of the conductor wiring pattern was 200 $\mu$m at the minimum. The conductor film o thickness, as measured after drying, was 41 $\mu$m on the average. This wiring pattern, like that of Example 3, was designed for verification of conductor resistance and composed of the straight lines in one direction alone. Then a thick film substrate was fabricated by following the same procedure as in Example 2.

Resistivity of the completed substrate was calculated from resistance at the wiring portion and sectional shape of the conductor portion. The measurements showed that the conductor width was 107±13 $\mu$m, conductor height (thickness) was 27±3 $\mu$m, and resistivity was 9.1 $\mu\Omega$.cm.

The above results demonstrate realization of low viscosity below 10 $\mu\Omega$.cm of the paste after baking. This represents a reduction of resistivity to about half in comparison with the conventional pastes. Also, the conductor width on the substrate was about 110 $\mu$m, which is about ⅔ of that of the conventional substrates, and when conductor interval and conductor width are assumed to be the same, there can be obtained a wiring substrate having about twice as high packaging density as the conventional products. This means that it is possible to obtain a wiring substrate having twice as high functional performance as the conventional substrates having the same surface area and to reduce the number of circuit layers to ½ of that required in the conventional substrates when the circuits used are supposed to be of the same performance. Further, by applying the contrivance of this invention to the conductor portion with a large current capacity, there can be obtained a thick film wiring substrate with a low calorific value and free of waveform blunting of high-speed signals.

EXAMPLE 6

(1) Preparation of Conductor Paste

A tungsten powder having an average particle diameter of 10 $\mu$m was weighed out to be 95 wt. % and mixed with 5 wt. % of a vehicle formed by dissolving 12 wt. % of a binder in a solvent. 45 cps ethyl cellulose was used as binder and nBCA as solvent. The materials were mixed by an automatic mixer comprising a mortar and a pestle for about one hour.

The resulting mixture was milled by the same roll mill as used in Example 2. The roll interval in the roll mill was initially adjusted so that the minimum distance between adjoining rolls would be about 30 $\mu$m. After about 30 minutes of milling, the roll interval was again adjusted so that the smallest distance between the bulging central parts of adjoining rolls would become 10 $\mu$m. This setting made the distance between the corresponding ends of adjoining rolls 35 $\mu$m, the greatest in distance between adjoining rolls. Under this condition, by setting the shear rate between the smallest distance (5 $\mu$m) portions of adjoining rolls at 3,000 s$^{-1}$, roll milling was performed for about 2 hours to prepare a conductor paste.

During the above operation, the paste portion which passed to the roll ends was returned to the central parts of the rolls by using a spatula from time to time.

Viscosity of the completed conductor paste, as measured at 25° C. and a shear rate of 4 s$^{-1}$, was 390 Pa.s.

(2) Fabrication of Thick-Film Multi-Layer Substrate

A conductor wiring pattern having a width of 100 $\mu$m was printed with the above paste on a mullite green sheet of about 200 $\mu$m in thickness by using a stencil printer. The spacing between lines of said conductor wiring pattern was 200 $\mu$m at the smallest. The conductor film thickness, as measured after drying, was 48 $\mu$m on the average. This wiring pattern, like that of Example 3, was designed to make verification of conductor resistivity and therefore composed of the straight lines in one direction alone. The ensuing process for fabricating a thick-film substrate was the same as in Example 3. Resistivity of the substrate thus obtained was calculated from resistance at the wiring portion and sectional configuration of the conductor portion. It was determined that conductor width was 103±11 $\mu$m, conductor height (thickness) was 42±5 $\mu$m, and resistivity was 8.6 $\mu\Omega$.cm.

The above results attest to the realization of low resistivity below 10 $\mu\Omega$.cm of the substrates according to the present invention. The above figure represents a reduction of resistivity to about half as compared with the case of using the conventional pastes. Also, conductor width could be reduced to about 100 μm, which is about ⅔ of that in the conventional substrates. Further, when conductor interval and conductor width are supposed to be the same, there can be obtained a wiring substrate having about twice as high packaging density as in the conventional products. These attainments are the same as given in Examples 2 and 5.

EXAMPLE 7

Examples 7 and 8 concern use of molybdenum for preparation of conductor pastes. In Example 7, a 13% ethyl cellulose solution in tridecanol was used as vehicle, and in Example 8, a 5% ethyl cellulose solution in nBCA was used as vehicle. The vehicles used in Examples 2 through 6 for the preparation of tungsten pastes can be similarly applied to the preparation of molybdenum pastes. This is because of close resemblance in both physical and chemical properties of the two metallic elements (W and Mo).

(1) Preparation of Conductor Paste

A weighed quantity of molybdenum powder having an average particle diameter of 2.5 μm was mixed with a vehicle formed by dissolving 13 wt. % of a binder in a solvent. 10 cps ethyl cellulose was used as binder and tridecanol as solvent. These materials were mixed by an automatic mixer comprising a mortar-pestle combination for about one hour.

The resulting mixture, in a state having masses of particles therein, was roll milled under the same operating conditions as in Example 2.

The relation of viscosity to composition of the thus obtained conductor paste at a temperature of 25° C. and a shear rate of 4 $s^{-1}$ was as shown in Table 3.

Table 3 shows that a reduction of resistivity to less than 10 μΩ.cm after baking can be realized when the molybdenum content in the mixture is in the range of 85 to 94 wt. %. This represents about half of resistivity of the conventional pastes.

(2) Fabrication of thick-film multi-layer substrate

There were prepared 5 types of mullite green sheets having a thickness of about 200 μm and punched to form about 100 μm through-holes at a pitch of 200 to 500 μm, and they were printed with the previously prepared conductor paste by a stencil printer, filling the through-holes with the paste. Then a conductor wiring pattern, 100 μm in width, was printed with the paste on the surface of each of said mullite green sheets by using a stencil printer. The inter-line spacing in said conductor wiring pattern was 200 μm at the smallest. Conductor film thickness, although slightly variable depending on paste composition and viscosity, was generally about 43 μm as measured after drying. Only one of the five sheets was printed on both sides.

The five sheets were placed one upon another squarely by making use of guide holes formed at four corners of each sheet and hot pressed at 120° C. to form a laminate. This laminate was heated to 1,650° C. in a hydrogen atmosphere to fabricate a thick-film multi-layer substrate.

Resistivity of the thus obtained substrate was calculated from resistance at the wiring portion and sectional configuration of the conductor portion and shown in Table 3. Conductor width was 100 ±15 μm and conductor height was 31±6 μm.

The conductor pad on the semiconductor element packaged side of the laminate, the pinned pad on the back side thereof and the solder-sealed conductor portion were coated with chromium (0.1 μm), copper (2 μm) and gold (0.1 μm) successively by the photolithographic and sputtering techniques to constitute a thick-film wiring substrate having a sectional structure similar to that of Example 2 shown in FIG. 3.

From the above results, it is appreciated that in accordance with this invention the conductor width can be reduced to about 100 μm, which is about ⅔ of that of the conventional products, and when conductor interval and conductor width are supposed to be the same, there can be obtained a wiring substrate having about twice as high packaging density as possible with the conventional products. This means that it is possible to double the functional performance of a substrate with a same surface area, and the number of circuit layers can be halved with the same circuit performance. Further, by applying the contrivance of this invention to the conductor portion with a large current capacity, there can be obtained a thick-film wiring substrate with a low calorific value and free of waveform blunting of high-speed signals.

(3) Preparation of Electronic Module

A high-temperature solder was placed on the pinned pad on the backside of the obtained thick-film multi-layer substrate and heated to about 350° C. to connect and fix the pins in the guide holes. Then a solder was placed on the semiconductor element packaging pad on the front side of the substrate and heated to about 300° C. to effect electric connection and fixing of memory and logic LSI chips. Lastly a low-temperature solder was placed on the solder sealed portion on the substrate surface and heated to about 250° C, and in this state a Kovar sealing cap was connected and secured in position to complete an electronic circuit module having a sectional structure similar to that shown in FIG. 4.

From the above, it will be appreciated that the present invention enables a size reduction substantially by half, doubling of packaging density, and fabrication of an electronic circuit module capable of high-speed signal propagation.

TABLE 3

| Properties | Molybdenum content (wt %) | | | | | |
| --- | --- | --- | --- | --- | --- | --- |
| | 82 | 85 | 88 | 91 | 94 | 97 |
| Viscosity of conductor paste (Pa · s) | 140 | 170 | 220 | 550 | 1010 | 2500 |
| Resistivity after baking (μΩ · cm) | 13.2 | 9.8 | 9.2 | 9.5 | 9.1 | 18.3 |

EXAMPLE 8

(1) Preparation of Conductor Paste 91 wt. % of molybdenum powder having an average particle diameter of 1.0 μm and 9 wt. % of a vehicle having 5 wt. % of a binder dissolved in a solvent were mixed. 10 cps ethyl cellulose was used as binder and n-butylcarbitol (nBC) as solvent. These materials were mixed by an automatic mixer comprising a mortar-pestle combination for about one hour. The resulting mixture was roll milled. Roll interval in the roll mill was adjusted so that the minimum distance between the adjoining rolls would be about 30 μm. After about 30 minutes of roll milling, the mixture was further kneaded. The blade-to-blade distance in the kneader was $2\pm1$ μm at the smallest and $1\pm5$ mm at the greatest. By setting the shear rate at the smallest distance (2 μm) portion at 10,000 $s^{-1}$, kneading was carried out for 2 hours to form a conductor paste.

Viscosity of the conductor paste thus obtained was 800 Pa.s as measured at 25° C. and a shear rate of 4 $s^{-1}$.

(2) Fabrication of Thick-Film Multi-Layer Wiring Substrate

A conductor wiring pattern having a width of 100 μm was printed with the paste on a mullite green sheet having a thickness of about 200 μm by using a stencil printer. Spacing between the lines of the conductor wiring pattern was 200 μm at the smallest. Conductor film thickness, as measured after drying, was 44 μm on the average. This wiring pattern, like that of Example 4, was designed for making verification of conductor resistivity, hence composed of the straight lines in one direction alone.

An about 200 μm thick non-printed mullite sheet was placed on the backside of the wiring sheet, while also an about 200 μm thick non-printed mullite sheet was placed on the front side so as not to cover the wiring conductor ends on the wiring sheet. The resulting assembly was hot pressed at 120° C. to form a laminate, and this laminate was heated to 1,650° C. in a hydrogen atmosphere to fabricate a thick-film substrate.

Resistivity of the thus obtained substrate was calculated from the measured value of resistance at the wiring portion and sectional geometry of the conductor portion. Consequently, conductor width was determined to be $98\pm10$ μm, conductor height (thickness) $33\pm4$ μm and resistivity 9.6 μΩ.cm.

The above results indicate realization of a reduction of resistivity of the present substrates to less than 10 μΩ.cm. This signifies about ⅓ of resistivity in comparison with the substrates using the conventional pastes.

According to the present invention, conductor width could be also reduced to about 100 μm, which is about ⅔ of that in the conventional products, and when conductor interval and conductor width are supposed to be the same, there can be obtained a wiring substrate having about twice as high packaging density as in the conventional products. This means that it is possible to double the functional performance of the substrate with the same surface area, and the number of circuit layers can be halved with the same circuit performance. Further, by applying the concept of this invention to the conductor portion with a large current capacity, it is possible to obtain a thick-film wiring substrate with a small calorific value and free of waveform blunting of high-speed signals.

As an incidental effect of the conductor paste according to this invention, it was confirmed that there would not place separation of metal powder and vehicle even when the paste was left as it was for more than half a year after its preparation, which indicates very excellent keeping quality of the present paste and its capability of long-time run of printing with high precision. This is quite remarkable in view of the fact that the conventional pastes comprising a mixture of a metal powder with a high specific gravity above 10 and a vehicle with a low specific gravity of about 1 were poor in shelf life, that is, there would take place separation of metal powder and vehicle in about one month after paste preparation, causing agglomeration of metal particles to hinder high-precision printing.

Featuring the compositions, preparation process and structures described above, the present invention can produce prominent effects such as mentioned below.

In the conventional pastes, because of high vehicle content, tungsten or molybdenum particles having as high a specific gravity as about 20 settle down in the vehicle with a specific gravity of about 1 within one month after preparation of the paste. In the case of the pastes according to this invention, there would not easily take place separation of vehicle and metal particles probably because of low vehicle content and adhesion of the vehicle around the metal particles.

Regarding the conductor paste used for forming a thick-film wiring circuit substrate according to this invention, it is possible to obtain a low-resistivity conductor paste having about twice as high a conductivity as the conventional pastes.

Further, as an incidental effect, the conductor pastes according to the present invention cause no separation of metal powder and vehicle even if the paste is left as it is for more than half a year after preparation, and thus the pastes of this invention have long-time useful life.

In practical use of the paste of this invention for fabricating a thick-film wiring substrate, it becomes possible to reduce the conductor width to about ⅔ of that of the conventional products, and when conductor interval and conductor width are supposed to be the same, the packaging density can be approximately doubled in comparison with the conventional substrates. Further, by applying the device of this invention to the conductor portion with a large current capacity, there can be obtained a thick-film wiring substrate with a small calorific value and free of waveform blunting of high-speed signals.

In addition, in accordance with the present invention, it is possible to realize an electronic circuit module which is about half in size and doubled in packaging density in comparison with the conventional ones and is also capable of high-speed signal propagation.

What is claimed is:

1. A conductor paste comprising 90 to 96% by weight of a metal powder mainly composed of tungsten and 4 to 10% by weight of an organic vehicle, said organic vehicle containing 5 to 13% by weight of a binder, wherein an average diameter of primary particles of said metal powder is 0.5 to 10 μm, and wherein said conductor paste provides a conductor with a resistivity of 10 μΩ.cm or below after being printed and baked.

2. A conductor paste according to claim 1, which comprises 92 to 94% by weight of a metal powder mainly composed of tungsten and 6 to 8% by weight of an organic vehicle.

3. A conductor paste comprising 91 to 94% by weight of a metal powder mainly composed of molybdenum and 6 to 9 by weight of an organic vehicle, said organic vehicle containing 5 to 13% by weight of a binder, wherein an average diameter of primary particles of said metal powder is 0.5 to 10 μm, and wherein said conductor paste provides a conductor with a resistivity of 10 μΩ.cm or below after being printed and baked.

4. A conductor paste comprising 90 to 96% by weight of a metal powder mainly composed of tungsten and 4 to 10% by weight of an organic vehicle, said organic vehicle containing 5 to 13% by weight of a binder, wherein an average diameter of primary particles of said metal powder is 0.5 to 10 μm and wherein said conductor paste is produced by a process comprising forcibly passing said metal powder and organic vehicle between barrel-shaped rolls in a kneader and thereby kneading to form a conductor paste, wherein the roll interval in said kneader is adjusted so that the smallest distance between adjoining barrel-shaped rolls is 5 μm or less and the shear rate therebetween is set at 1000 $S^{-1}$ or more to provide a conductor paste which provides a conductor with a resistivity of 10 μΩ.cm or below after being printed and baked.

5. A conductor paste comprising 92 to 94% by weight of a metal powder mainly composed of molybdenum and 6 to 9% by weight of an organic vehicle, said organic vehicle containing 5 to 13% by weight of a binder, wherein an average diameter of primary particles of said metal powder is 0.5 to 10 μm and wherein said conductor paste is produced by a process comprising forcibly passing said metal powder and organic vehicle between barrel-shaped rolls in a kneader and thereby kneading to form a conductor paste, wherein the roll interval in said kneader is adjusted so that the smallest distance between adjoining barrel-shaped rolls is 5 μm or less and the shear rate therebetween is set at 1000 $S^{-1}$ or more to provide a conductor paste which provides a conductor with a resistivity of 10 μΩ.cm or below after being printed and baked.

* * * * *